(12) United States Patent
Takayoshi et al.

(10) Patent No.: US 12,288,678 B2
(45) Date of Patent: Apr. 29, 2025

(54) SUBSTRATE PROCESSING APPARATUS AND SUBSTRATE TRANSFER POSITION ADJUSTMENT METHOD

(71) Applicant: TOKYO ELECTRON LIMITED, Tokyo (JP)

(72) Inventors: Joji Takayoshi, Miyagi (JP); Hidehiko Sato, Miyagi (JP); Hiroshi Nagahata, Miyagi (JP); Yuri Kimura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 369 days.

(21) Appl. No.: 17/706,465

(22) Filed: Mar. 28, 2022

(65) Prior Publication Data

US 2022/0310369 A1   Sep. 29, 2022

(51) Int. Cl.
*H01L 21/66*   (2006.01)
*H01J 37/20*   (2006.01)
*H01J 37/32*   (2006.01)

(52) U.S. Cl.
CPC ........ *H01J 37/32935* (2013.01); *H01J 37/20* (2013.01); *H01J 37/32091* (2013.01);
(Continued)

(58) Field of Classification Search
CPC ...... H01J 37/32935; H01J 37/32; H01J 37/20; H01J 37/32091; H01J 37/32642; H01J 37/32733; H01J 37/3271; H01J 2237/334; H01J 2237/202; H01J 2237/2441; H01J 2237/22; H01J 37/32715; H01L 21/66;
(Continued)

(56) References Cited

U.S. PATENT DOCUMENTS

| 4,819,167 A * | 4/1989 | Cheng | H01L 21/681 700/59 |
| 2005/0104017 A1* | 5/2005 | Kimba | H01J 37/29 250/559.07 |

(Continued)

FOREIGN PATENT DOCUMENTS

| JP | 2000-127069 A | 5/2000 |
| JP | 2010-505277 A | 2/2010 |

(Continued)

*Primary Examiner* — Nikolay K Yushin
(74) *Attorney, Agent, or Firm* — Nath, Goldberg & Meyer; Jerald L. Meyer; Tanya E. Harkins

(57) ABSTRACT

A substrate processing apparatus includes a process module that includes: a stage having a first surface on which a substrate is placed and a second surface, a process module including an edge ring placed on the second surface, a measurement unit measuring an etching rate of the substrate; and a controller. The controller transfers the substrate to different transfer positions on the first surface and etches the substrate for each transfer position, acquires etching rates at points on a concentric circle of the substrate in an end of the substrate, for each transfer position, from the measurement unit, generates an approximate curve of each of the concentric circles based on each of the acquired etching rates for each transfer position, calculates each linear expression representing a movement direction of the substrate, based on the approximate curve for each transport position, and calculates an intersection coordinate of the linear expressions.

19 Claims, 15 Drawing Sheets

(52) U.S. Cl.
CPC .. *H01J 37/32642* (2013.01); *H01J 37/32733* (2013.01); *H01L 22/20* (2013.01); *H01J 2237/334* (2013.01)

(58) Field of Classification Search
CPC ... H01L 21/67207; H01L 21/67; H01L 21/68; H01L 21/67069; H01L 21/67259; H01L 21/68735; H01L 22/20; H01L 22/29; H01L 22/30; H01L 22/00; H01L 22/12
See application file for complete search history.

(56) References Cited

U.S. PATENT DOCUMENTS

| | | | | |
|---|---|---|---|---|
| 2006/0215152 | A1* | 9/2006 | Hashimoto | H01L 21/681 356/237.2 |
| 2008/0220621 | A1* | 9/2008 | Shinozaki | H01L 21/68 438/795 |
| 2015/0287625 | A1* | 10/2015 | Fujimoto | H01L 21/67253 382/151 |
| 2017/0032510 | A1* | 2/2017 | Francken | G06T 7/0004 |
| 2020/0161154 | A1* | 5/2020 | Sugita | H01L 21/68707 |
| 2022/0037177 | A1* | 2/2022 | Fukuzaki | H01L 21/67259 |

FOREIGN PATENT DOCUMENTS

| | | |
|---|---|---|
| JP | 2013-125796 A | 6/2013 |
| JP | 2016-110066 A | 6/2016 |

* cited by examiner

FIG. 6
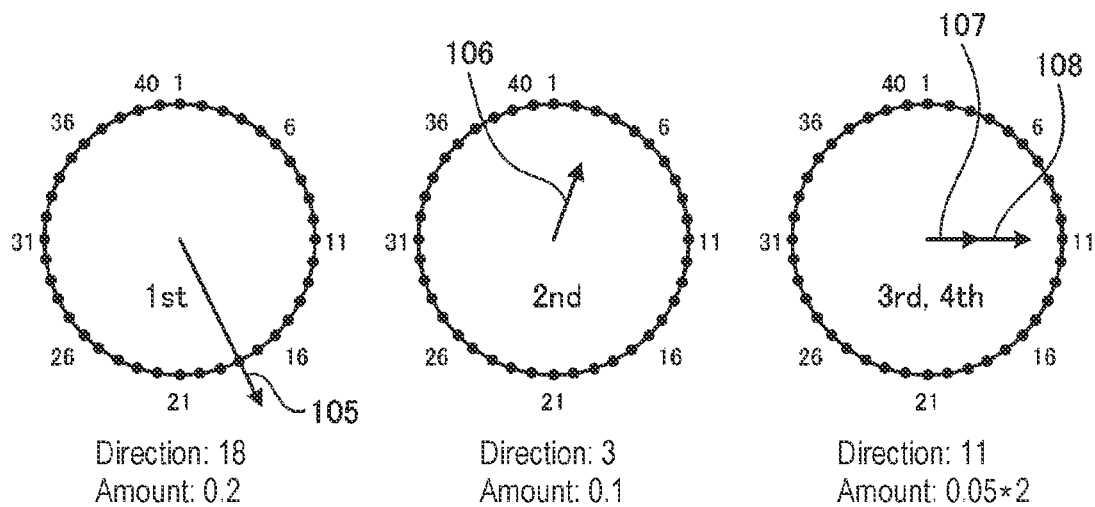
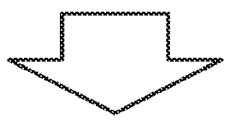
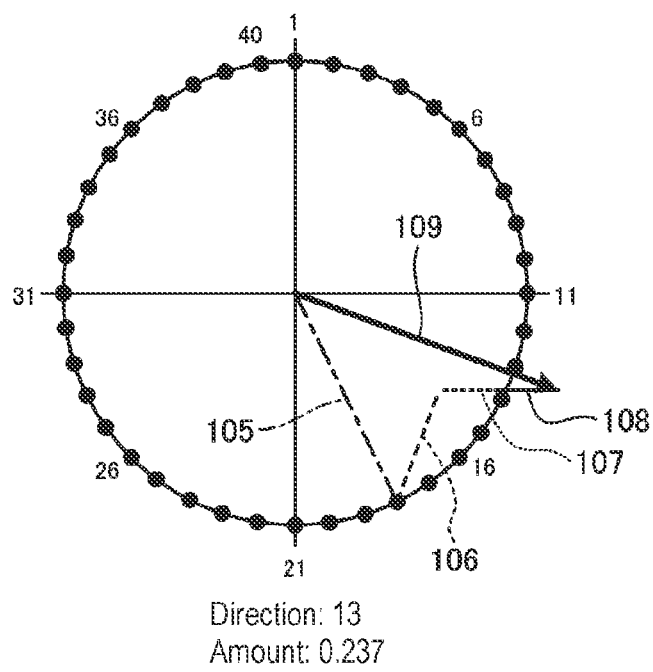

| Sampling No. (≒X) | ER | Approximate value (=y) | Square error (y−ER)^2 |
|---|---|---|---|
| 1 | 162.306 | y(1) | (162.306−y(1))^2 |
| 2 | 162.595 | y(2) | (162.595−y(2))^2 |
| 3 | 162.524 | y(3) | (162.254−y(3))^2 |
| ⋮ | ⋮ | ⋮ | ⋮ |

Sum (square error)

FIG. 15
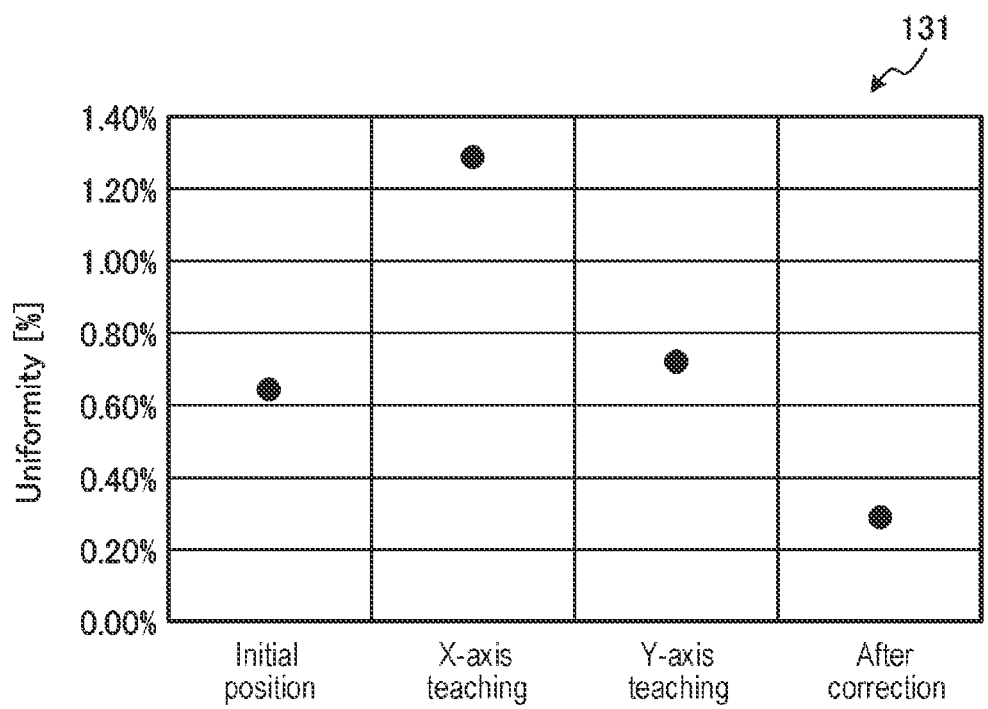

SUBSTRATE PROCESSING APPARATUS AND SUBSTRATE TRANSFER POSITION ADJUSTMENT METHOD

CROSS-REFERENCE TO RELATED APPLICATION

This application claims priority to Japanese Patent Applications No. 2021-055553, filed on Mar. 29, 2021, the entire contents of which are incorporated herein by reference.

TECHNICAL FIELD

The present disclosure relates to a substrate processing apparatus and a substrate transfer position adjustment method.

BACKGROUND

In a case of performing an etching process by a substrate processing apparatus, an edge ring placed around a substrate to be processed is periodically replaced to be consumed. It is known that the replaced edge ring includes an error in an installation position, which may lead to a misalignment in relative position between the edge ring and the substrate, resulting in significantly adversely affecting the characteristics at the outer peripheral portion of the substrate. On the other hand, it is known that in order to correct the error in relative position between the edge ring and the substrate, so-called teaching is performed in which position coordinates are stored in a controller while the transfer position of the substrate is visually being checked.

PRIOR ART DOCUMENT

Patent Document

Patent Document 1:
 Japanese Patent Application Publication No. 2000-127069

SUMMARY

A substrate processing apparatus according to one aspect of the present disclosure includes: a process module that includes a stage provided inside a chamber, having a first placement surface on which a substrate is to be placed and a second placement surface disposed on an outer periphery of the first placement surface, and an edge ring placed on the second placement surface; a measurement unit that measures an etching rate of the substrate; and a controller, wherein the controller is configured to control the substrate processing apparatus to transfer the substrate to different transfer positions on the first placement surface and etch the substrate for each transfer position under a specific processing condition, the controller is configured to control the substrate processing apparatus to acquire etching rates at a plurality of points on a concentric circle of the substrate in the vicinity of an end portion of the substrate, for each transfer position, from the measurement unit, the controller is configured to control the substrate processing apparatus to generate an approximate curve of each of the concentric circles in a circumferential direction based on each of the acquired etching rates for each transfer position, the controller is configured to control the substrate processing apparatus to calculate each linear expression representing a movement direction of the substrate, based on the generated approximate curve for each transport position, and the controller is configured to control the substrate processing apparatus to calculate an intersection coordinate of the linear expressions.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is a view illustrating an example in a case where an operator performs teaching.

FIG. 15 is a view illustrating an example of a result of teaching according to the second embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of substrate processing apparatus and a substrate transfer position adjustment method disclosed herein will be described in detail with reference to drawings. The disclosed technology is not limited to the following embodiments.

As teaching, in addition to a method of performing transfer position adjustment visually, there is a method of performing the transfer position adjustment based on process characteristics such as an etching rate, or so-called etching rate teaching. In the etching rate teaching of the related art, an operator manually adjusts a transfer position according to process characteristics. However, it is difficult to quantitatively calculate an appropriate adjustment amount by these methods. Therefore, adjustment accuracy may not be good, or adjustment man-hours may be large. Therefore, it is expected that the substrate transfer position can be accurately and easily adjusted. The present disclosure relates to etching rate teaching, which is hereinafter referred to simply as teaching.

First Embodiment

[Configuration of Substrate Processing Apparatus]

Figure 1:
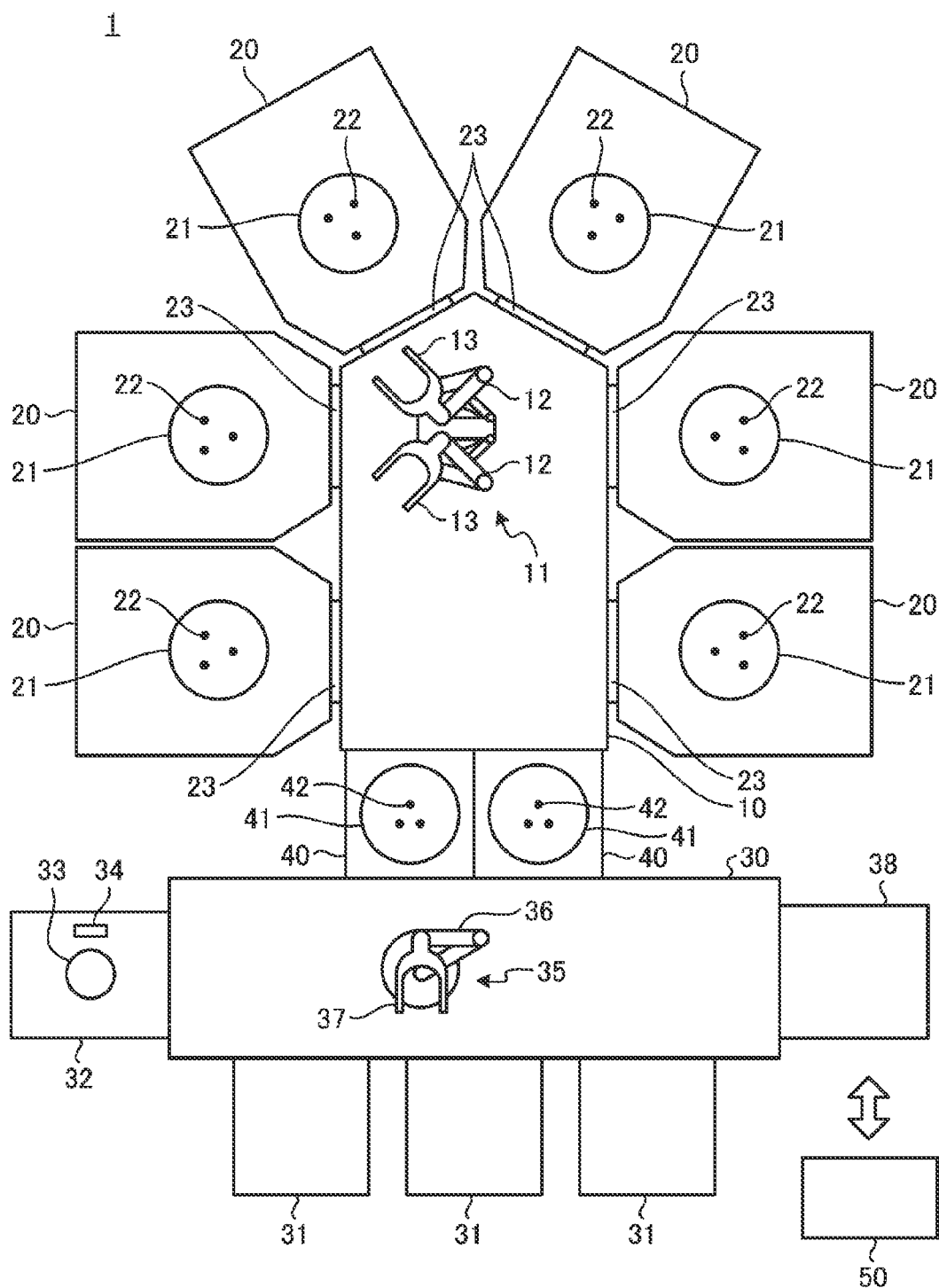
FIG. 1 is a cross-sectional plan view illustrating an example of a substrate processing apparatus according to a first embodiment of the present disclosure.

FIG. 1 is a cross-sectional plan view illustrating an example of a substrate processing apparatus according to a first embodiment of the present disclosure. A substrate processing apparatus 1 illustrated in FIG. 1 is a substrate processing apparatus capable of performing various processes such as plasma processing on a substrate (hereinafter, also referred to as a wafer) one by one.

As illustrated in FIG. 1, the substrate processing apparatus 1 includes a transfer module 10, six process modules 20, a loader module 30, and two load-lock modules 40.

The transfer module 10 has a substantially pentagonal shape in a plan view. The transfer module 10 includes a vacuum chamber with a transfer mechanism 11 disposed therein. The transfer mechanism 11 includes a guide rail (not illustrated), two arms 12, and a fork 13 disposed at the distal end of each arm 12 to support the wafer. Each arm 12 is of a scalar arm type and is configured to be freely turnable and extensible. The transfer mechanism 11 moves along the guide rail to transfer the wafer between the process modules 20 and the load-lock module 40. The transfer mechanism 11 is not limited to the configuration illustrated in FIG. 1 as long as the transfer mechanism 11 can transfer the wafer between the process modules 20 and the load-lock module 40. For example, each arm 12 of the transfer mechanism 11 may be configured to be freely tunable, extensible, and may be configured to be freely elevated.

The process modules 20 are disposed radially around the transfer module 10 and coupled to the transfer module 10. The process module 20 is an example of a plasma processing apparatus. The process module 20 includes a processing chamber and includes a columnar substrate support 21 (stage) disposed therein. The substrate support 21 includes a plurality of thin rod-shaped lift pins 22 protruding freely from the upper surface. Each lift pin 22 is disposed on the same circumference in a plan view, and protrudes from the upper surface of the substrate support 21 to support and lift the wafer placed on the substrate support 21, and at the same time, the lift pins 22 retreat into the substrate support 21 to place the wafer to be supported on the substrate support 21. After the wafer is placed on the substrate support 21, the process module 20 decompresses the inside to introduce a processing gas, applies a radio-frequency power to the inside to generate a plasma, and performs plasma processing on the wafer by the plasma. The transfer module 10 and the process module 20 are separated from each other by an openable/closable gate valve 23.

The loader module 30 is disposed to face the transfer module 10. The loader module 30 is a rectangular parallelepiped and is an atmospheric transport chamber held in an atmospheric atmosphere. The two load-lock modules 40 are coupled to one side surface of the loader module 30 along the longitudinal direction. Three load ports 31 are coupled to the other side surfaces of the loader module 30 along the longitudinal direction. A front-opening unified pod (FOUP) (not illustrated), which is a container that accommodates a plurality of wafers, is placed in the load port 31. An aligner 32 is coupled to one side surface of the loader module 30 along the lateral direction. Further, a transfer mechanism 35 is disposed in the loader module 30. Further, a measurement unit 38 is coupled to the other side surface of the loader module 30 along the lateral direction.

The aligner 32 makes alignment of the wafer. The aligner 32 includes a rotating stage 33 to be rotated by a driving motor (not illustrated). The rotating stage 33 has, for example, a diameter smaller than a diameter of the wafer, and is configured to be rotatable in a state where the wafer is placed on the upper surface thereof. An optical sensor 34 for detecting the outer peripheral edge of the wafer is provided in the vicinity of the rotating stage 33. In the aligner 32, the optical sensor 34 detects the center position of the wafer and the direction of the notch with respect to the center of the wafer, and the wafer is delivered to a fork 37 described later so that the center position and notch direction of the wafer are in a predetermined position and a predetermined direction. Accordingly, the transfer position of the wafer is adjusted so that the center position of the wafer and the direction of the notch are in the predetermined position and the predetermined direction in the load-lock module 40.

The transfer mechanism 35 includes a guide rail (not illustrated), an arm 36, and the fork 37. The arm 36 is of a scalar arm type and is configured to be movable along the guide rail and configured to be freely turnable, extensible, and elevatable. The fork 37 is disposed at the distal end of the arm 36 to support the wafer. In the loader module 30, the transfer mechanism 35 transfers the wafer between the FOUP placed in each load port 31, the aligner 32, the measurement unit 38, and the load-lock module 40. The transfer mechanism 35 is not limited to the configuration illustrated in FIG. 1 as long as the transfer mechanism 35 can transfer the wafer between the FOUP, the aligner 32, the measurement unit 38, and the load-lock module 40.

The measurement unit 38 measures the amount of etching performed on the wafer having been subjected to the etching process in the process module 20. The measurement unit 38 calculates the etching rate based on the measured etching amount and the time of the etching process. That is, the measurement unit 38 measures the etching rate. The measurement unit 38 outputs the measured etching rate to a control device 50 to be described later. The measurement unit 38 is not limited to the position adjacent to the loader module 30, and may be disposed inside the loader module 30.

The load-lock module 40 is disposed between the transfer module 10 and the loader module 30. The load-lock module 40 includes an internal pressure variable chamber whose inner space can be switched to vacuum or atmospheric pressure, and includes a columnar stage 41 disposed therein. When transferring the wafer from the loader module 30 to the transfer module 10, the load-lock module 40 maintains the inside at atmospheric pressure to receive the wafer from the loader module 30, and then decompresses the inside to carry the wafer into the transfer module 10. Further, when carrying the wafer out from the transfer module 10 to the loader module 30, the load-lock module 40 maintains the inside at vacuum pressure to receive the wafer from the transfer module 10, and then boosts the inside to atmospheric pressure to carry the wafer into the loader module 30. The stage 41 includes three thin rod-shaped lift pins 42 protruding freely from the upper surface thereof. Each lift pin 42 is disposed on the same circumference in a plan view, protrudes from the upper surface of the stage 41 to support and lift the wafer, and retreats into the stage 41 to place the wafer to be supported on the stage 41. The load-lock module 40 and the transfer module 10 are separated by an openable/closable gate valve (not illustrated). Further, the load-lock module 40 and the loader module 30 are separated by an openable/closable gate valve (not illustrated).

The substrate processing apparatus 1 includes the control device 50. The control device 50 is, for example, a computer, and includes a central processing unit (CPU), a random access memory (RAM), a read only memory (ROM), an auxiliary storage device, and the like. The CPU operates based on a program stored in the ROM or the auxiliary storage device to control the operation of each component in the substrate processing apparatus 1.

[Configuration of Process Module 20]

Figure 2:
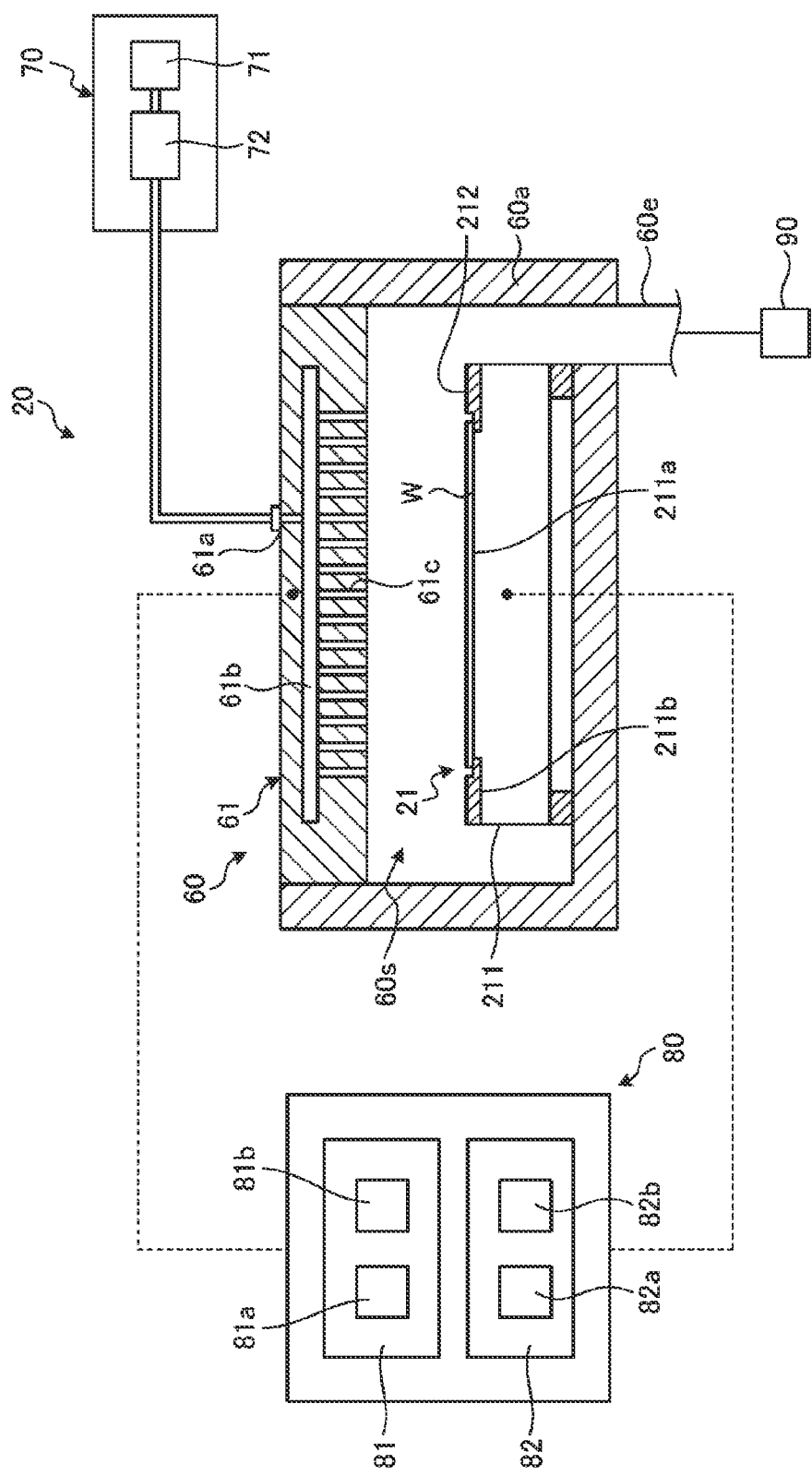
FIG. 2 is a view illustrating an example of a plasma processing apparatus according to the first embodiment.

Next, a configuration example of a capacitively-coupling plasma processing apparatus that is an example of the process module 20 will be described. In the following description, the process module 20 will also be referred to as a capacitively-coupling plasma processing apparatus 20 or simply as a plasma processing apparatus 20. FIG. 2 is a view illustrating an example of a plasma processing apparatus according to the first embodiment.

The capacitively-coupling plasma processing apparatus 20 includes a plasma processing chamber 60, a gas supply 70, a power source 80, and an exhaust system 90. Further, the plasma processing apparatus 20 includes a substrate support 21 and a gas introduction unit. The gas introduction unit is configured to introduce at least one processing gas into the plasma processing chamber 60. The gas introduction unit includes a shower head 61. The substrate support 21 is disposed in the plasma processing chamber 60. The shower head 61 is disposed above the substrate support 21. In one embodiment, the shower head 61 constitutes at least a part of a ceiling of the plasma processing chamber 60. The plasma processing chamber 60 has a plasma processing space 60s defined by the shower head 61, a sidewall 60a of the plasma processing chamber 60, and the substrate support 21. The sidewall 60a is grounded. The shower head 61 and the substrate support 21 are electrically insulated from a housing of the plasma processing chamber 60.

The substrate support 21 includes a main body 211 and a ring assembly 212. The main body 211 has a central region (substrate support surface) 211a for supporting the substrate (wafer) W, and an annular region (ring support surface) 211b for supporting the ring assembly 212. The annular region 211b of the main body 211 surrounds the central region 211a of the main body 211 in a plan view. The wafer W is disposed on a central region 211a of the main body 211, and a ring assembly 212 is disposed on an annular region 211b of a main body 211 to surround the wafer W on the central region 211a of the main body 211. In one embodiment, the main body 211 includes a base and an electrostatic chuck. The base includes a conductive member. The conductive member of the base functions as a lower electrode. The electrostatic chuck is disposed on the base. The upper surface of the electrostatic chuck has a substrate support surface 211a. The ring assembly 212 includes one or more annular members. At least one of the one or more annular members is an edge ring. Although not illustrated, the substrate support 21 may include a temperature control module configured to adjust at least one of the electrostatic chuck, the ring assembly 212 and the wafer W to a target temperature. The temperature control module may include a heater, a heat transfer medium, a flow path, or a combination thereof. A heat transfer fluid, such as brine or gas, flows through the flow path. Further, the substrate support 21 may include a heat transfer gas supply configured to supply a heat transfer gas between the rear surface of the substrate W and the substrate support surface 211a.

The shower head 61 is configured to introduce at least one processing gas from the gas supply 70 into the plasma processing space 60s. The shower head 61 has at least one gas supply port 61a, at least one gas diffusion chamber 61b, and a plurality of gas introduction ports 61c. The processing gas supplied to the gas supply port 61a passes through the gas diffusion chamber 61b and is introduced into the plasma processing space 60s from the plurality of gas introduction ports 61c. Further, the shower head 61 includes a conductive member. The conductive member of the shower head 61 functions as an upper electrode. The gas introduction unit may include, in addition to the shower head 61, one or more side gas injectors (SGI) that are attached to one or more openings formed in the sidewall 60a.

The gas supply 70 may include at least one gas source 71 and at least one flow rate controller 72. In one embodiment, the gas supply 70 is configured to supply at least one processing gas from the respective corresponding gas sources 71 to the shower head 61 via the respective corresponding flow rate controllers 72. Each flow rate controller 72 may include, for example, a mass flow controller or a pressure-controlled flow rate controller. Further, the gas supply 70 may include at least one flow rate modulation device that modulates or pulses the flow rate of at least one processing gas.

The power source 80 includes an RF power source 81 coupled to plasma processing chamber 60 via at least one impedance matching circuit. The RF power source 81 is configured to supply at least one RF signal (RF power), such as the source RF signal and the bias RF signal, to the conductive member of the substrate support 21 and/or the conductive member of the shower head 61. As a result, plasma is formed from at least one processing gas supplied into the plasma processing space 60s. Accordingly, the RF power source 81 may function as at least a part of the plasma generator. Further, by supplying a bias RF signal to the conductive member of the substrate support 21, a bias potential is generated in the wafer W, and ionic components in the formed plasma can be drawn into the wafer W.

In one embodiment, the RF power source 81 includes a first RF generator 81a and a second RF generator 81b. The first RF generator 81a is configured to be coupled to the conductive member of the substrate support 21 and/or the conductive member of the shower head 61 via at least one impedance matching circuit to generate a source RF signal (source RF power) for plasma generation. In one embodiment, the source RF signal has a frequency in the range of 13 MHz to 150 MHz. In one embodiment, the first RF generator 81a may be configured to generate a plurality of source RF signals having different frequencies. The generated one or more source RF signals are supplied to the conductive member of the substrate support 21 and/or the conductive member of the shower head 61. The second RF generator 81b is configured to be coupled to the conductive member of the substrate support 21 via at least one impedance matching circuit to generate a bias RF signal (bias RF power). In one embodiment, the bias RF signal has a lower frequency than the source RF signal. In one embodiment, the bias RF signal has a frequency in the range of 400 kHz to 13.56 MHz. In one embodiment, the second RF generator 81b may be configured to generate a plurality of bias RF signals having different frequencies. The generated one or more bias RF signals are supplied to the conductive member of the substrate support 21. Further, in various embodiments, at least one of the source RF signal and the bias RF signal may be pulsed.

Further, the power source 80 may include a DC power source 82 coupled to the plasma processing chamber 60. The DC power source 82 includes a first DC generator 82a and a second DC generator 82b. In one embodiment, the first DC generator 82a is configured to be connected to the conductive member of the substrate support 21 and configured to generate a first DC signal. The generated first DC signal is applied to the conductive member of the substrate support 21. In one embodiment, the first DC signal may be applied to another electrode, such as an electrode in an electrostatic chuck. In one embodiment, the second DC generator 82b is configured to be connected to the conductive member of the shower head 61 to generate a second DC signal. The generated second DC signal is applied to the conductive member of the shower head 61. In various embodiments, the first and second DC signals may be pulsed. The first and second DC generators 82a and 82b may be provided in addition to the RF power source 81, and the first DC generator 82a may be provided instead of the second RF generator 81b.

The exhaust system 90 may be connected to, for example, a gas exhaust port 60e disposed at a bottom portion of the plasma processing chamber 60. The exhaust system 90 may include a pressure adjusting valve and a vacuum pump. The pressure in the plasma processing space 60s is adjusted by the pressure adjusting valve. The vacuum pump may include a turbo molecular pump, a dry pump, or a combination thereof.

[Calculation of Movement Direction]

Figure 3:
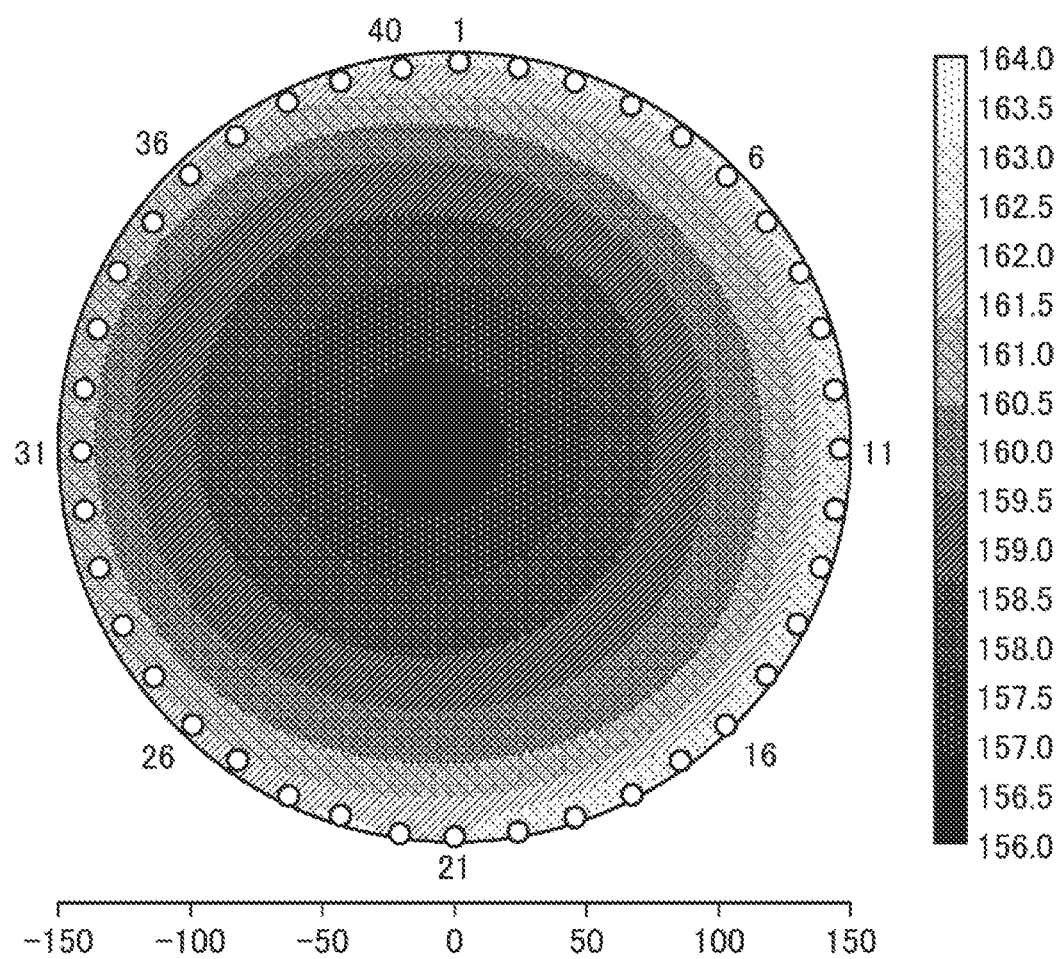
FIG. 3 is a contour view illustrating an example in a case where there is a misalignment of a wafer.

Next, the calculation of the movement direction of the wafer W will be described with reference to FIGS. 3 to 7. FIG. 3 is a contour view illustrating an example in a case where there is a misalignment of a wafer. In the contour view illustrated in FIG. 3, the sampling numbers "1" to "40" set on the circumference of the outer peripheral portion of the wafer W and the etching rate of the oxide film (Ox) are illustrated. The sampling numbers are set at equal intervals on a circumference having a radius of 147 mm, which is a concentric circle of the wafer W. In the example of FIG. 3, it can be seen that the etching rate in the vicinity of the sampling number "36" is slow, and the etching rate in the vicinity of the sampling number "18" is fast. The relationship between the etching rate and the position of the wafer W is such that the wafer W and the edge ring are spaced apart from each other as the etching rate is higher. The concentric circle for setting the sampling numbers is preferably spaced apart from the end portion of the wafer W by 30 mm or less.

Figure 4:
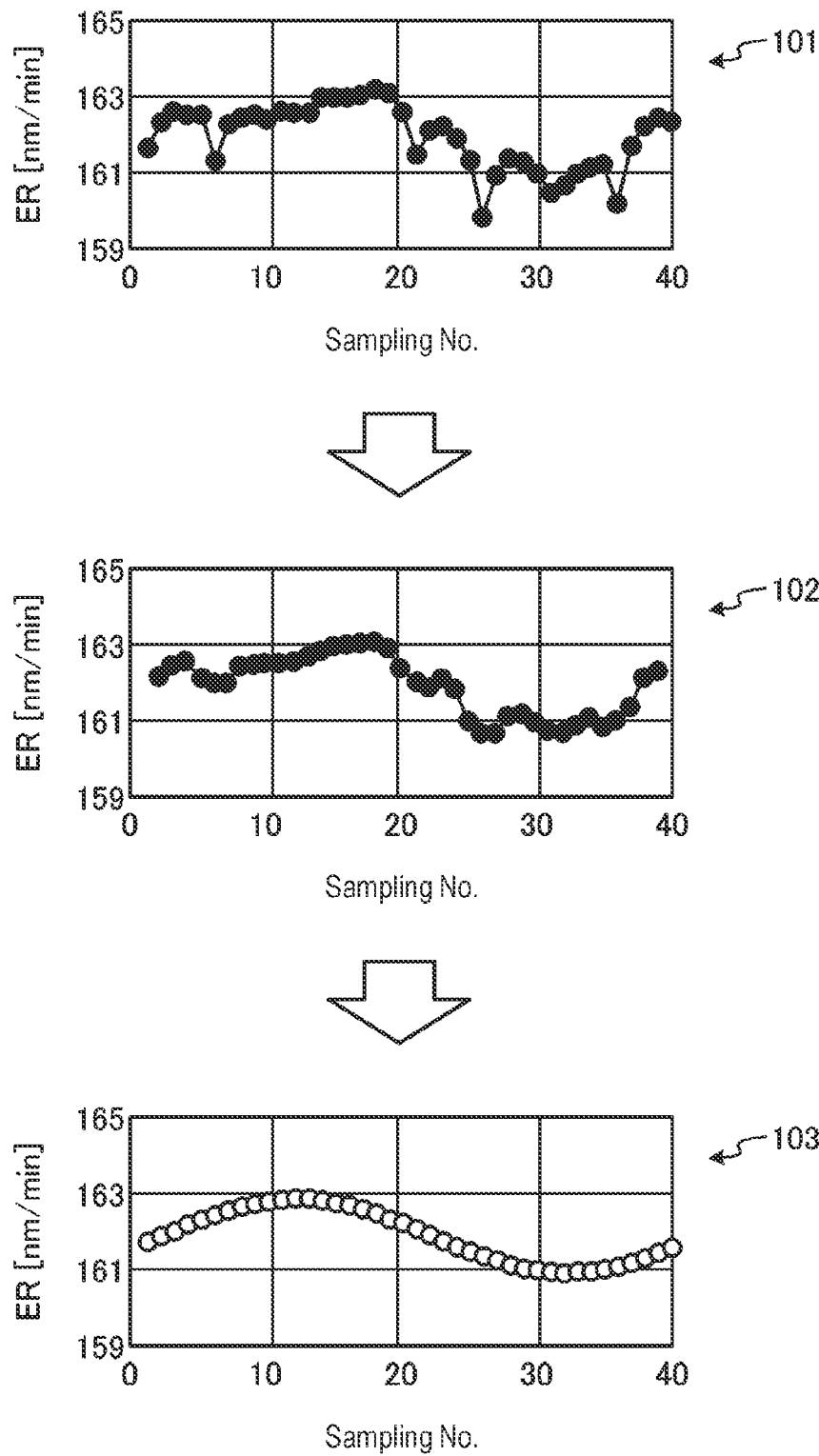
FIG. 4 is a view illustrating an example of generation of an approximate curve of etching rates.

FIG. 4 is a view illustrating an example of generation of an approximate curve of etching rates. As illustrated in FIG. 4, a graph 101 is a graph obtained by plotting raw data at the etching rates of the sampling numbers "1" to "40" set in FIG. 3. The graph 101 includes noise caused by elements other than the horizontal position of the wafer W, such as the vertical position and particles. The graph 102 is a graph obtained by performing a flattening process on the graph 101 by using a moving average of three points. The graph 103 is a graph in which an approximate curve is generated by performing fitting on the graph 102 with sine approximation. In the graph 103, the direction corresponding to the sampling number where the etching rate is the maximum is the direction where the edge ring and the wafer W are farthest apart from each other. That is, the direction in which the etching rate becomes the maximum is the direction in which the wafer W is to be moved.

Figure 5:
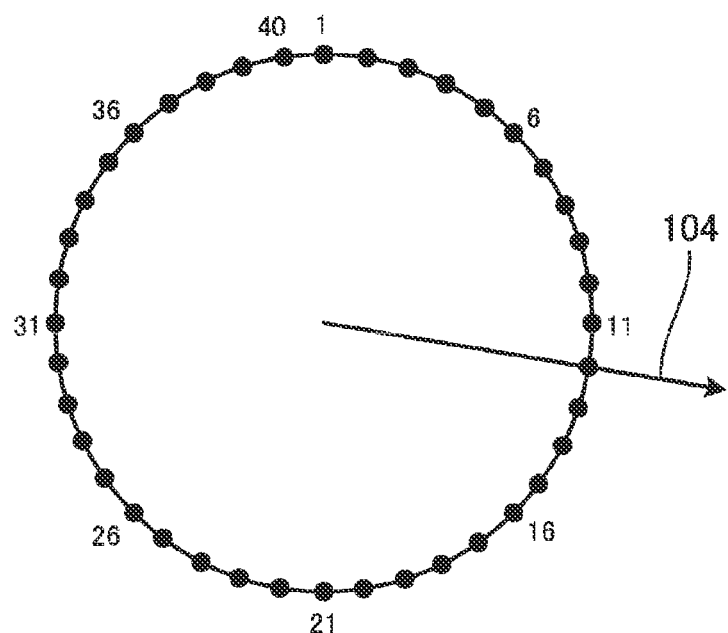
FIG. 5 is a view illustrating an example in a case of performing teaching using the approximate curve.

FIG. 5 is a view illustrating an example in a case of performing teaching using the approximate curve. The direction in which the etching rate becomes the maximum in the graph 103 of FIG. 4 is the direction of the sampling number "12". Accordingly, the wafer W moves by once teaching in the direction of the sampling number "12" as indicated by the vector 104 in FIG. 5. The movement amount is not known from the graph 103.

FIG. 6 is a view illustrating an example in a case where an operator performs teaching. Meanwhile, when the operator performs the teaching, since the etching rate of the sampling number "18" is the maximum in the graph 101 of FIG. 4, the transfer position of the wafer W is adjusted to move by 0.2 mm in the direction of the sampling number "18" for the first time, as indicated by a vector 105 of FIG. 6. Thereafter, the etching process is performed to measure the etching rates of the sampling numbers "1" to "40", and when the etching rates are plotted in the same manner as in the graph 101, it is assumed that the etching rate of the sampling number "3" is the maximum. The operator adjusts the transfer position of the wafer W for the second time to move by 0.1 mm in the direction of the sampling number "3", as indicated by a vector 106. Thereafter, similarly, the etching process is performed after the adjustment, and the operator adjusts the transfer position of the wafer W by 0.05 mm in the direction of the sampling number "11" as indicated by a vector 107 for the third time and a vector 108 for the fourth time. As a result of the operator performing the teaching four times, the wafer W has moved by 0.237 mm in the direction of the sampling number "13" indicated by a vector 109 in which the vectors 105 to 108 are combined. In this way, in the vector 104 of FIG. 5 using the sine approximation, the direction of the sampling number "12" can be determined by once teaching, while the teaching will be performed four times to obtain the vector 109 when the operator performs the teaching. That is, when the sine approximation is used, the movement direction can be calculated by once teaching without undergoing unnecessary movement due to noise in the etching rate.

Next, the details of the generation of the approximation curve by the sine approximation will be described. In the sine approximation, Equation (1) below is used.

$$y = a \sin b(x+c) + d \qquad (1)$$

Here, a parameter 'a' indicates the amplitude of the sine wave, that is, the deviation of the etching rate. The parameter 'a' substantially corresponds to the movement amount of the wafer W. A parameter 'b' represents the cycle of the sine wave, and only the plane deviation between the edge ring and the wafer W is considered. In other words, since there is only a sample for one round of the circumference, the parameter 'b' is fixed to "1". A parameter 'c' represents the phase of the sine wave and represents the polarization direction of the wafer W. The parameter 'c' substantially corresponds to the movement direction of the wafer W. A parameter 'd' represents an offset, and is set to a fixed value by the average etching rate of the sampling numbers "1" to "40". By setting the parameters 'b' and 'd' to fixed values, the solution of the simultaneous equations is prevented from diverging or falling to a local optimal solution.

Figures 7, 8:
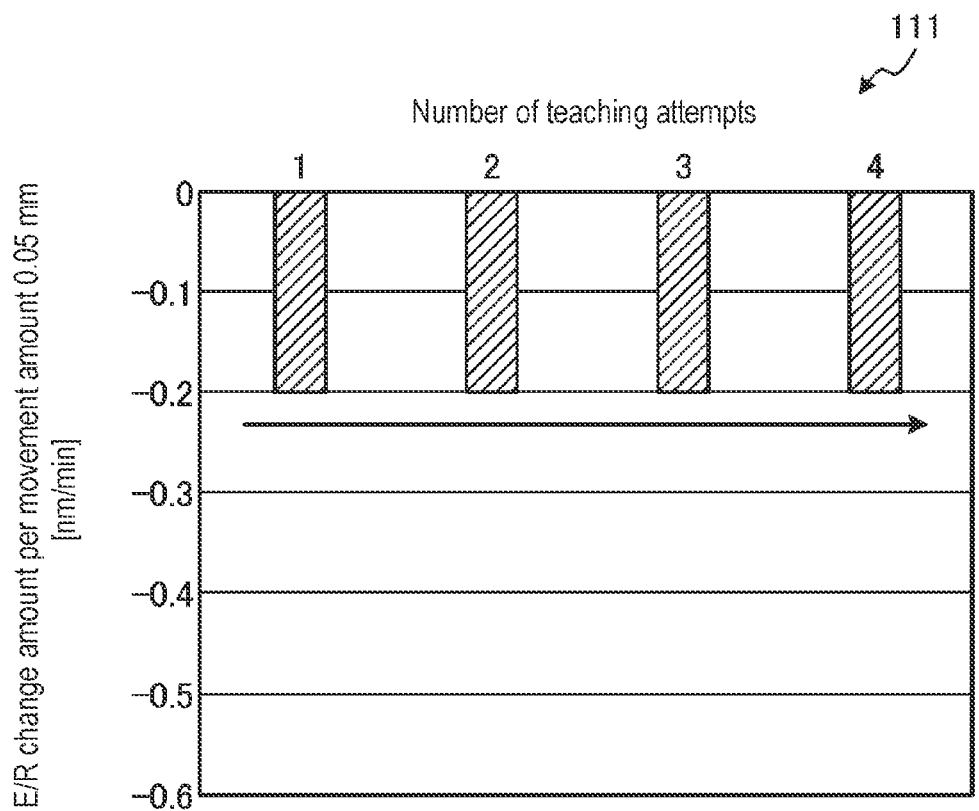
FIG. 7 is a view illustrating an example of parameters in a sine approximation method.
FIG. 8 is a graph illustrating an example of a relationship between a movement amount and an etching rate of the wafer in the first embodiment.

FIG. 7 is a view illustrating an example of parameters in a sine approximation method. The table 110 shown in FIG. 7 illustrates some of the parameters used by spreadsheet software to perform the sine approximation using a solver that calculates optimal values while changing the values of a plurality of variables. The column "sampling No." indicates the above-described sampling number, and when substituted into x, a value expressed in radians is used. The column "ER" indicates the actual measurement value (unit: "nm") of the etching rate for the corresponding sampling number. The column "approximate value" corresponds to Equation (1), and indicates y which is an approximate value of the etching rate in a case where x corresponding to the sampling number is entered and arbitrary values are entered into the parameters 'a' and 'c'. The column "square error" indicates the square error between the approximate value and the actually measured value. With the solver, the parameters 'a' and 'c' that minimize the sum of the square errors represented by "sum (square error)" are obtained for the 40 rows corresponding to the sampling numbers "1" to "40" in the table 110. Other algorithms may be used as long as the solution of the simultaneous equations of Equation (1) corresponding to the sampling numbers "1" to "40" is obtained, that is, as long as the sine approximation is performed by moving the parameters 'a' and 'c'.

[Calculation 1 of Movement Amount]

FIG. 8 is a graph illustrating an example of a relationship between a movement amount and an etching rate of the wafer in the first embodiment. A graph 111 illustrated in FIG. 8 is a graph illustrating an example of the relationship in a case where the correlation between the movement amount of the wafer W and the etching rate is simple. In the graph 111, the amount of change in the etching rate is shown in a case where the movement amount of the wafer W per teaching is set to 0.05 mm, and four attempts are performed. In the first time of the teaching, the etching rate changes by −0.2 nm/min when the wafer W is moved 0.05 mm from an initial position. In the second time, when the wafer W is moved 0.05 mm from the position in the first time, the etching rate changes by −0.2 nm/min. Similarly, in each of the third and fourth times as well, when the wafer W is moved by 0.05 mm from the previous position, the etching rate changes by −0.2 nm/min. That is, in the example of the graph 111, the amount of change in the etching rate per the movement amount of the wafer W is constant.

Figure 9:
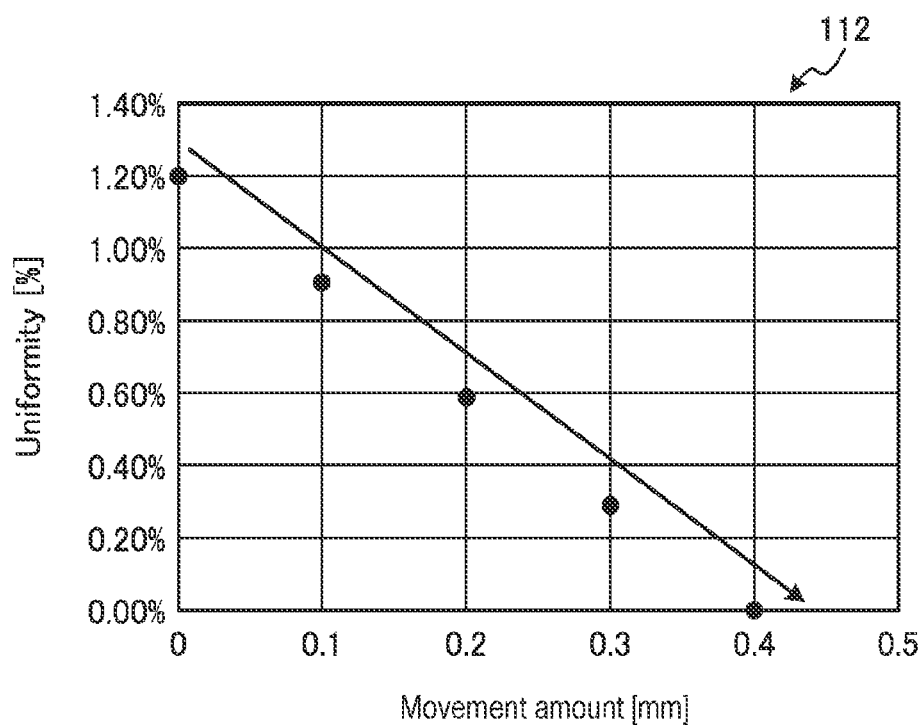
FIG. 9 is a graph illustrating an example of a relationship between the movement amount and uniformity of the wafer in the first embodiment.

FIG. 9 is a graph illustrating an example of a relationship between the movement amount and uniformity of the wafer in the first embodiment. A graph 112 illustrated in FIG. 9 is a graph illustrating an example of the relationship when the correlation between the movement amount of the wafer W and uniformity is simple. Here, the uniformity represents the uniformity of the etching rate, and corresponds to the amplitude of a sine approximate curve. The graph 112 is a graph in which the uniformity for each movement amount 0.1 mm is plotted from the movement amount 0 mm to 0.4 mm, and the change in the uniformity is linear. When a relationship as illustrated in the graph 111 or the graph 112 is observed, a database representing the relationship between the movement amount and the etching rate, or the relationship between the movement amount and the amplitude (uniformity) of the approximate curve is prepared in advance. When the etching rate is acquired by performing the teaching once, the movement amount of the wafer W can be calculated from the amount of change in the etching rate or the uniformity by referencing the database prepared in advance.

[Transfer Position Adjustment Method]

Figure 10:
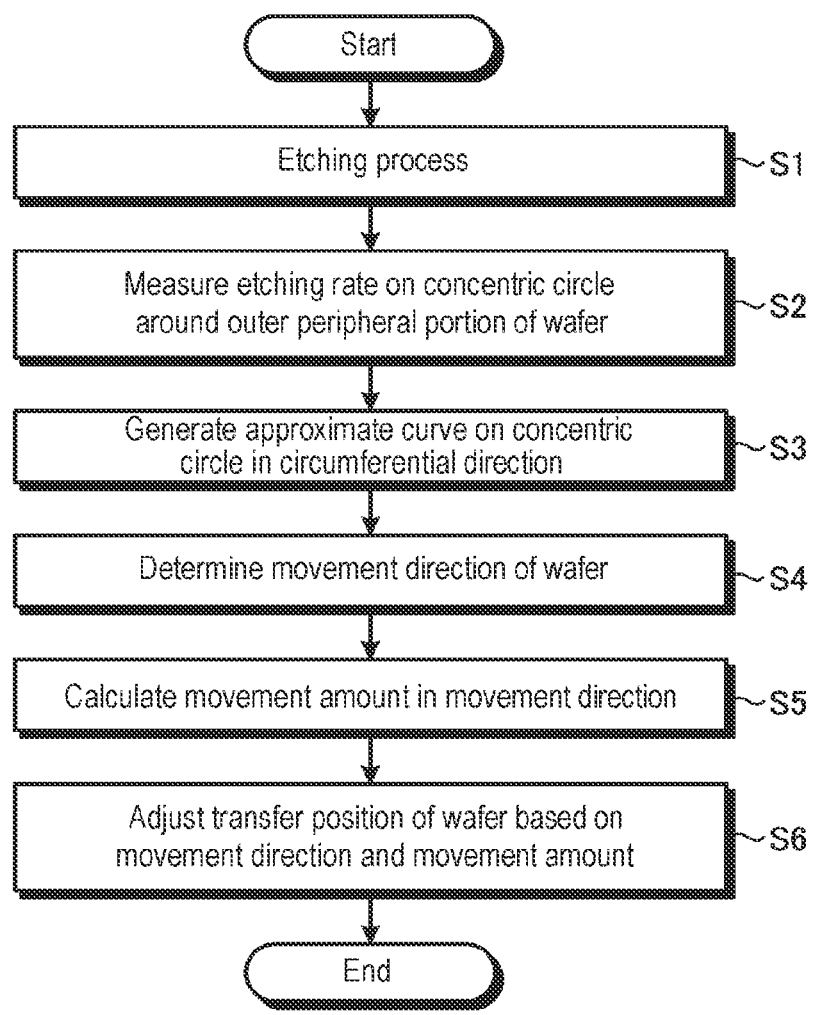
FIG. 10 is a flowchart illustrating an example of transfer position adjustment processing in the first embodiment.

Next, a method of adjusting the transfer position in the substrate processing apparatus 1 of the first embodiment will be described. FIG. 10 is a flowchart illustrating an example of transfer position adjustment processing in the first embodiment. In the following description, the operation of each component in the substrate processing apparatus 1 is controlled by control device 50.

The control device 50 transfers the wafer W accommodated in the FOUP of the load port 31 to the process module 20 through the loader module 30, the load-lock module 40, and the transfer module 10, and places the wafer W on the substrate support surface 211a of the main body 211. In order to measure the etching rate, for example, a silicon oxide film (SiO2) is formed on the wafer W.

The control device 50 then closes the opening and controls the exhaust system 90 to evacuate the gas from a plasma processing space 60s so that the atmosphere in the plasma processing space 60s reaches a predetermined vacuum level. Further, the control device 50 controls a temperature control module (not illustrated) to adjust the temperature of the wafer W so that the temperature becomes a predetermined temperature. The control device 50 starts supplying a process gas, and fills the plasma processing space 60s with the processing gas. As the process gas, for example, a fluorine-containing gas is used. The control device 50 etches the wafer W with the plasma generated in response to the source RF signal and bias RF signal supplied from an RF power source 81 (step S1).

When the etching process is completed, the control device 50 stops supplying the process gas, the source RF signal, and the bias RF signal, and opens an opening (not illustrated). The control device 50 carries the wafer W out from the process module 20, and transfers the wafer W to the measurement unit 38 through the transfer module 10, the load-lock module 40, and the loader module 30.

The control device 50 measures and acquires an etching rate on the concentric circle around the outer peripheral portion of the wafer W in the measurement unit 38 (step S2). Based on the acquired etching rate, the control device 50 generates the sine approximate curve of the concentric circle in the circumferential direction (step S3). The control device 50 determines the movement direction of the wafer W based on the generated sine approximate curve (step S4).

The control device 50 calculates the movement amount of the wafer W in the determined movement direction with reference to the database representing the relationship between the movement amount and the etching rate, or the relationship between the movement amount and the uniformity (the amplitude of the sine approximate curve) (step S5). Based on the determined movement direction and the calculated movement amount, the control device 50 adjusts the transfer position of the wafer W on the substrate support surface 211a in a case where the transfer mechanism 11 transfers the wafer W to the process module 20 (step S6). In this way, in the substrate processing apparatus 1 of the first embodiment, since the movement direction and the movement amount of the wafer W are determined based on the etching rate, the substrate transfer position can be accurately and easily adjusted. Further, the maintenance time can be shortened. Further, the substrate transfer position can be adjusted without exposing the plasma processing chamber 60 to the atmosphere even during the operation of the substrate processing apparatus 1.

Second Embodiment

In the first embodiment described above, when the correlation between the movement amount and the etching rate is simple, the movement amount of the wafer W is calculated with reference to the database prepared in advance. However, when the correlation between the movement amount and the etching rate is complicated, it is difficult to prepare a database. In this case, the movement direction and the movement amount of the wafer W may be calculated by intentionally shifting the transfer position and acquiring the etching rate twice. An embodiment in this case will be described as a second embodiment. Since the configuration of a substrate processing apparatus in the second embodiment is the same as that in the first embodiment, the description of the overlapping configuration and operations thereof will be omitted.

[Calculation 2 of Transfer Amount]

Figure 11:
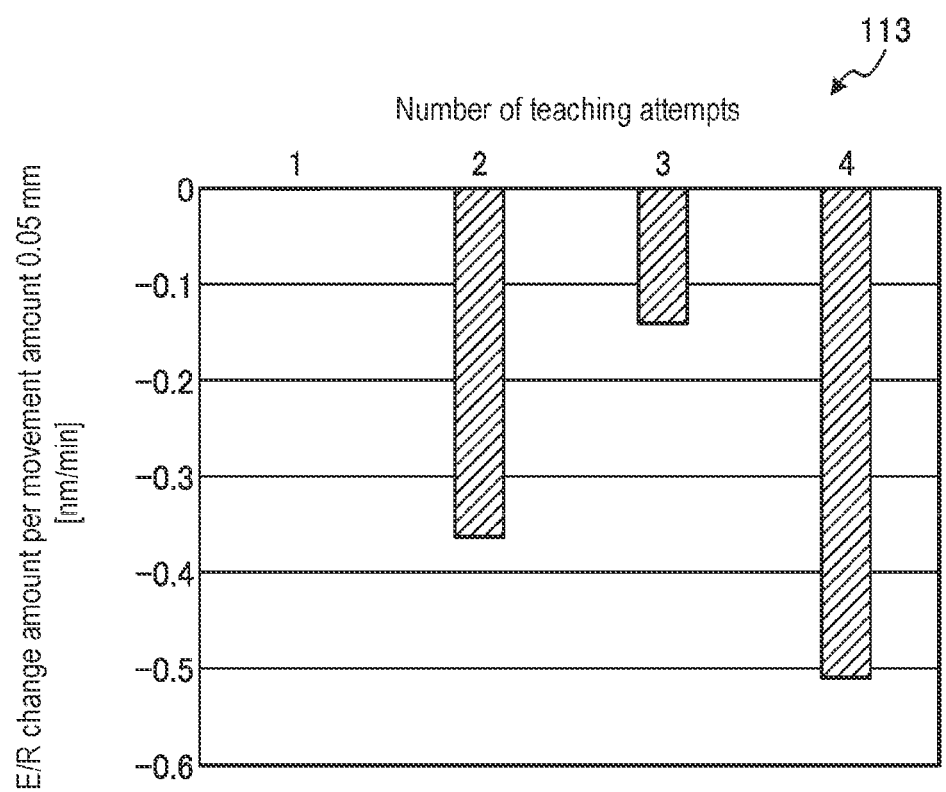
FIG. 11 is a graph illustrating an example of a relationship between a movement amount and an etching rate of a wafer in a second embodiment.

FIG. 11 is a graph illustrating an example of a relationship between a movement amount and an etching rate of a wafer in a second embodiment. A graph 113 illustrated in FIG. 11 is a graph illustrating an example of the relationship in a case where the correlation between the movement amount and the etching rate of the wafer W is complicated. In the graph 113, the amount of change in the etching rate is represented in a case where the movement amount of the wafer W per teaching is set to 0.05 mm, and four attempts are performed. In the first time of teaching, when the wafer W is moved 0.05 mm from an initial position, the amount of change in the etching rate hardly changes as 0.0 nm/min. In the second time, when the wafer W is moved 0.05 mm from the first time position, the etching rate changes by −0.37 nm/min. In the third time, when the wafer W is moved 0.05 mm from the second time position, the etching rate changes by −0.14 nm/min. In the fourth time, when the wafer W is moved 0.05 mm from the third time position, the etching rate changes by −0.51 nm/min. That is, in the example of the graph 113, the amount of change in the etching rate per the movement amount of the wafer W is not constant.

Figure 12:
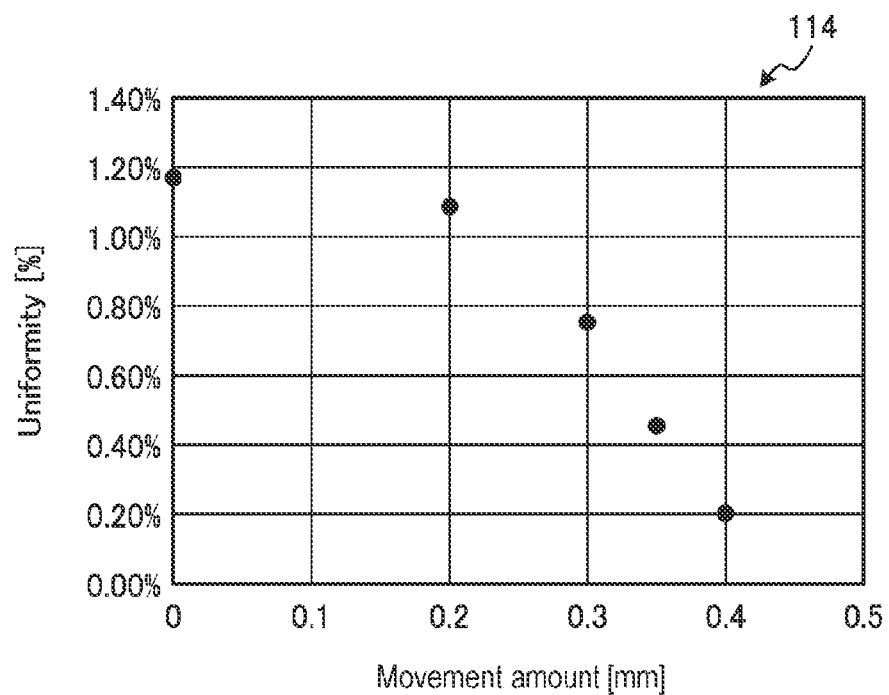
FIG. 12 is a graph illustrating an example of a relationship between the movement amount and uniformity of the wafer in the second embodiment.

FIG. 12 is a graph illustrating an example of a relationship between the movement amount and uniformity of the wafer in the second embodiment. A graph 114 illustrated in FIG. 12 is a graph illustrating an example of the relationship in a case where the correlation between the movement amount and the uniformity of the wafer W is complex. Here, the uniformity represents the uniformity of the etching rate, and corresponds to the amplitude of a sine approximate curve. In the graph 114, the uniformity is plotted at the movement amount 0.0 mm, 0.2 mm, 0.3 mm, 0.35 mm, 0.4 mm, and the change in the uniformity is nonlinear. In a case of the relationship as illustrated in the graph 113 or the graph 114, each etching rate is acquired by intentionally shifting the transfer position and performing the teaching twice. Next, by generating a linear expression representing movement directions by twice and calculating the coordinate of the intersection point of the linear expressions, the movement direction and movement amount of the wafer W can be calculated.

Figure 13:
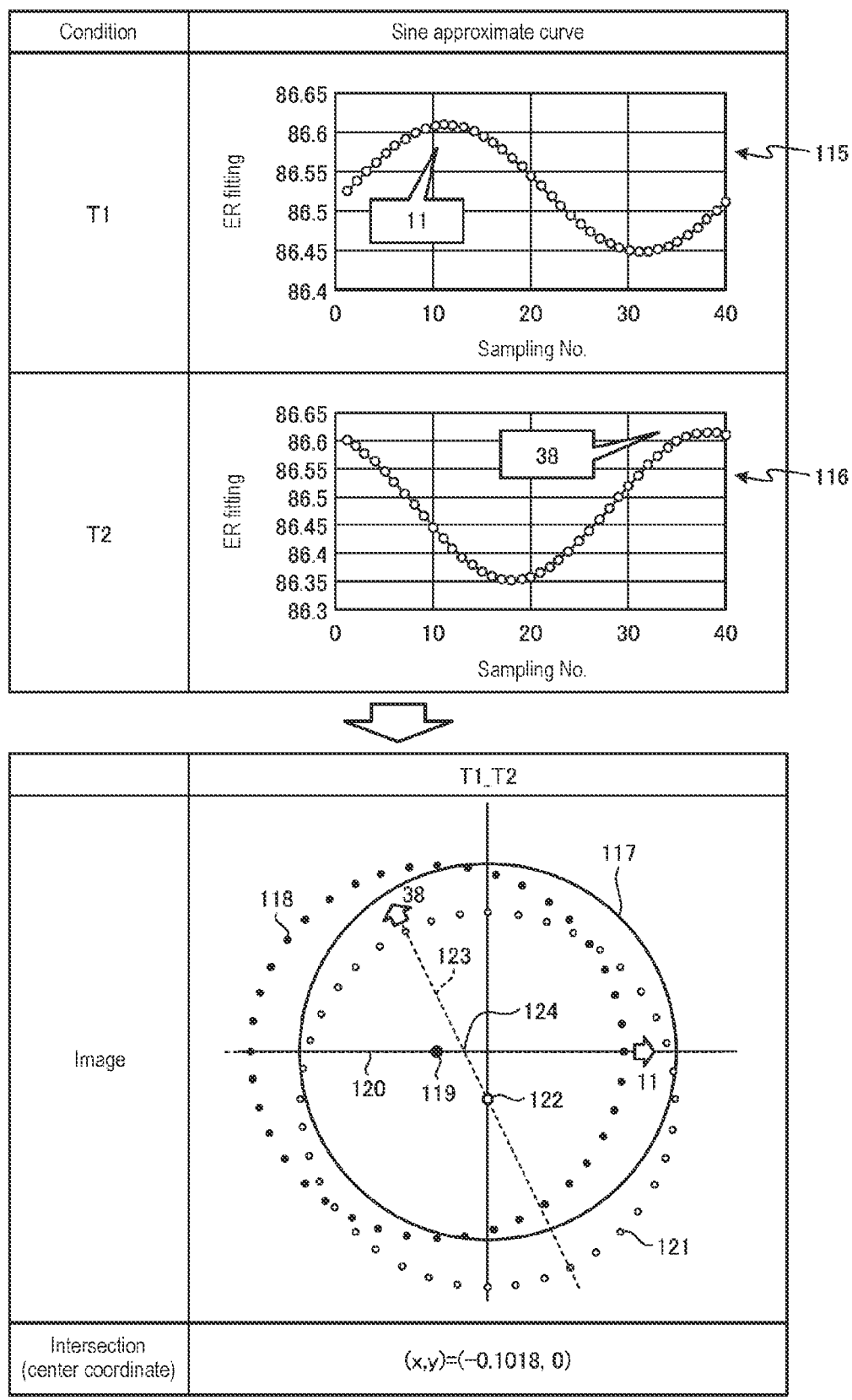
FIG. 13 illustrates an example of linear expressions representing movement directions and an intersection coordinate of the linear expressions in the second embodiment.

FIG. 13 illustrates an example of linear expressions representing movement directions and an intersection coordinate of the linear expressions in the second embodiment. In FIG. 13, the center coordinate of the wafer W at the start of the evaluation is defined by (x, y)=(0, 0), the center coordinate of the wafer W under the condition T1 at the transfer position is defined by (x, y)=(−0.2, 0), and the center coordinate of the wafer W under the condition T2 at the transfer position is defined by (x, y)=(0, −0.2). That is, in the condition T1, the transfer position of the wafer W is intentionally moved by −0.2 mm in an x-axis direction, and in the condition T2, the transfer position of the wafer W is intentionally moved by −0.2 mm in a y-axis direction.

As illustrated in FIG. 13, first, the control device 50 calculates the movement direction from graphs 115 and 116 of the sine approximate curves under the conditions T1 and T2 of the transfer position. Under the condition T1, the control device 50 calculates that the movement direction of the wafer W is the direction of the sampling number 111, based on the graph 115. Under the condition T2, the control device 50 calculates that the movement direction of the wafer W is the direction of the sampling number 1381, based on the graph 116.

Next, the control device 50 draws a concentric circle 118 around the outer peripheral portion of the wafer W at the transfer position under the condition T1, using as a reference a concentric circle 117 of the outer peripheral portion of the wafer W at the start of evaluation. Since the movement direction of the wafer W under the condition T1 is the direction of the sampling number [11], the control device 50 draws a straight line 120 that couples the point on the concentric circle 118 corresponding to the sampling number [11] and a center 119 of the concentric circle 118. In other words, the linear expression representing the movement direction of the wafer W under the condition T1 can be calculated as a linear expression representing the straight line 120.

Similarly, the control device 50 draws a concentric circle 121 around the outer peripheral portion of the wafer W at the transfer position under the condition T2 using the concentric circle 117 as a reference. Since the movement direction of the wafer W under the condition T2 is the direction of the sampling number "38", the control device 50 draws a straight line 123 that couples the point on the concentric circle 121 corresponding to the sampling number "38" and a center 122 of the concentric circle 121. In other words, the linear expression representing the movement direction of the wafer W under the condition T2 can be calculated as the linear expression representing the straight line 123. The linear expressions representing the straight lines 120 and 123 may be represented by vectors each representing a sampling number as a movement direction.

The control device 50 then calculates the coordinate of an intersection 124 between the straight line 120 and the straight line 123. The intersection 124 serves as coordinate of the corrected center position of the wafer W. In the example of FIG. 13, the coordinate of the intersection point 124 is (x, y)=(−0.1018, 0). In this way, by performing twice the teaching in which the transfer position is intentionally shifted, the movement direction and movement amount of the wafer W can be calculated.

[Transfer Position Adjustment Method]

Figure 14:
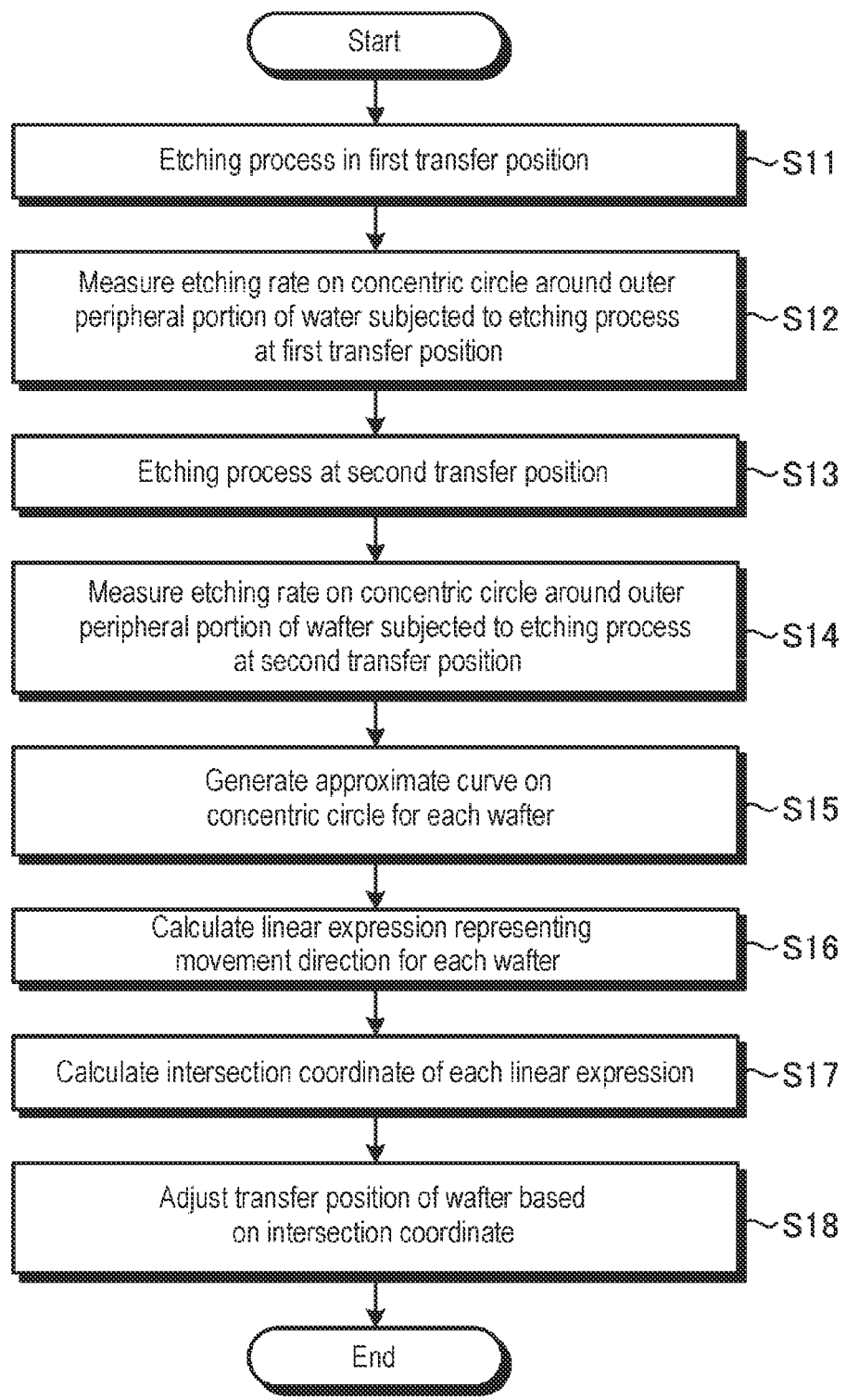
FIG. 14 is a flowchart illustrating an example of a transfer position adjustment process in the second embodiment.

Next, a method of adjusting the transfer position in the substrate processing apparatus 1 of the second embodiment will be described. FIG. 14 is a flowchart illustrating an example of a transfer position adjustment process in the second embodiment.

The control device 50 transfers the wafer W accommodated in the FOUP of the load port 31 to the process module 20 through the loader module 30, the load-lock module 40, and the transfer module 10, and places the wafer W on a first transfer position of the substrate support surface 211a of the main body 211. Thereafter, similar to step S1 of the first embodiment, the control device 50 etches the wafer W at the first transfer position (step S11).

When the etching process is completed, similar to step S2 of the first embodiment, the control device 50 measures and acquires the etching rate on the concentric circle around the outer peripheral portion of the wafer W at the first transfer position in the measurement unit 38 (step S12).

Next, the control device 50 transfers the other wafer W accommodated in the FOUP of the load port 31 to the process module 20 through the loader module 30, the load-lock module 40, and the transfer module 10, and places the wafer W on a second transfer position of the substrate support surface 211a of the main body 211. Thereafter, similar to step S1 of the first embodiment, the control device 50 etches the wafer W at the second transfer position (step S13).

When the etching process is completed, similar to step S2 of the first embodiment, the control device 50 measures and acquires the etching rate on the concentric circle around the outer peripheral portion of the wafer W at the second transfer position in the measurement unit 38 (step S14). When the silicon oxide film on the wafer W etched at the first transfer position has a sufficient thickness, the etching process may be performed at the second transfer position by using the wafer W, and the etching rate may be calculated from the difference in the etching amount.

Based on the acquired etching rate of the wafer W at each of the first transfer position and the second transfer position, the control device 50 generates a sine approximate curve of the concentric circle in the circumferential direction for each wafer W (step S15). Based on the generated sine approximate curve, the control device 50 determines the movement direction of the wafer W. and calculates a linear expression representing the movement direction for each wafer W (step S16). The control device 50 calculates the intersection coordinate of the linear expressions (step S17). That is, the control device 50 calculates the movement direction and the movement amount of the wafer W. Based on the calculated intersection coordinate, the control device 50 adjusts the transfer position of the wafer W on the substrate support surface 211a in a case where the transfer mechanism 11 transfers the wafer W to the process module 20 (step S18). In this way, in the substrate processing apparatus 1 of the second embodiment, the substrate transfer position can be accurately and easily adjusted by intentionally shifting the transfer position and performing the teaching twice. Further, the maintenance time can be shortened. Further, the substrate transfer position can be adjusted without exposing the plasma processing chamber 60 to the atmosphere even during the operation of the substrate processing apparatus 1.

[Test Results]

Figure 16:
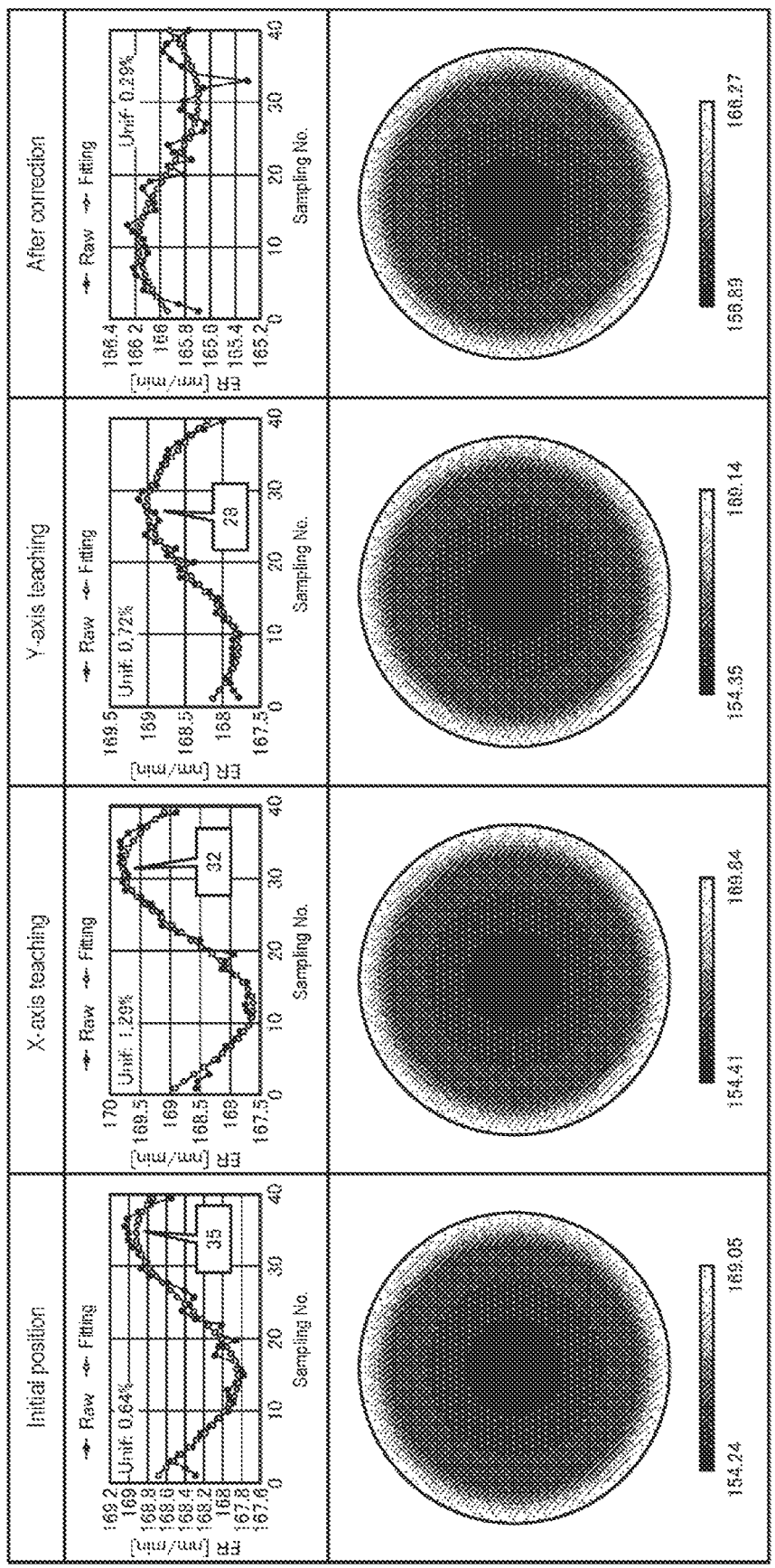
FIG. 16 is a view illustrating an example of the result of the teaching according to the second exemplary embodiment.

Next, the test results of the teaching in the second embodiment will be described with reference to FIGS. 15 and 16. FIGS. 15 and 16 are views illustrating an example of the results of the teaching in the second embodiment. In this experiment, the teaching was performed under the conditions T10 to T12 corresponding to the initial position, the X-axis teaching, and the Y-axis teaching in the table 130 shown in FIG. 15, and after correction, that is, as a result of the teachings, a condition T13 was acquired. In the graph 131 of FIG. 15, the uniformities corresponding to the initial position, the X-axis teaching and the Y-axis teaching, and after the correction are plotted on the graph. Further, FIG. 16 illustrates Raw data of etching rates, sine approximate curves after fittings, and contour drawings corresponding to the initial position, the X-axis teaching and the Y-axis teaching, and after the correction.

As illustrated in FIGS. 15 and 16, under the condition T10 of the initial position, when the movement amount was zero, that is, when (x, y)=(0, 0) was defined as the reference coordinate, the movement direction was the direction of the sampling number "35". Further, the uniformity at the initial position was 0.64%. The initial position was measured for comparison with the corrected position, and may be omitted in the teaching.

Under the condition T11 of the X-axis teaching, when the movement amount, that is, the coordinate of the center position of the wafer W was defined by (x, y)=(0.2, 0), the movement direction was the direction of the sampling number "32". Further, the uniformity in the X-axis teaching was 1.29%.

Under the condition T12 of the Y-axis teaching, when the movement amount, that is, the coordinate of the central position of the wafer W was defined by (x, y)=(0, 0.2), the movement direction was the direction of the sampling number "28". Further, the uniformity in the Y-axis teaching was 0.72%.

When the intersection coordinate of the linear expression corresponding to the conditions T11 and T12 was calculated, the coordinate was (x, y)=(−0.25, 0.07). When the transfer position was corrected (adjusted) such that the center position of the wafer W was the intersection coordinate, that is, when the etching rate was measured under the condition T13, the uniformity was 0.29%. When the initial position and the corrected uniformity were compared, an improvement from 0.64% to 0.29% was confirmed. The measurement of the corrected etching rate under the condition T13 is measured for comparison with the initial position, and may be omitted in the teaching.

The movement direction of the wafer W during twice teaching is not limited to the X-axis direction and the Y-axis direction, and may intersect at any angle as long as an intersection of the linear expressions can be obtained. Further, in order to stabilize the error, it is preferable that the movement direction of the wafer W during twice teaching intersect at 90°; however, for example, the movement direction of the wafer W may intersect at an angle of 45°. Further, by use of the corrected result, that is, by use of three or more linear expressions, the intersection coordinate may be recalculated. In this case, the accuracy of the transfer position can be further improved.

As described above, according to the second embodiment, the substrate processing apparatus 1 includes: the process module 20 including a stage (main body 211) provided inside a chamber (plasma processing chamber 60), having a first placement surface (substrate support surface 211a) on which a substrate (wafer W) is to be placed and a second placement surface (ring support surface 211b) disposed on the outer periphery of the first placement surface, and an edge ring (ring assembly 212) placed on the second placement surface; the measurement unit 38 which measures the etching rate of the substrate; and a controller (the control device 50). The controller is configured to control the substrate processing apparatus 1 to transfer the substrate to different transfer positions on the first placement surface and etch the substrate for each transfer position under a specific processing condition. The controller is configured to control the substrate processing apparatus to acquire, from the measurement unit 38, etching rates at a plurality of points on a concentric circle of the substrate in the vicinity of an end portion of the substrate, for each transfer position. The controller is configured to control the substrate processing apparatus 1 to generate an approximate curve of each of the concentric circles in the circumferential direction, based on each of the acquired etching rates for each transfer position. The controller is configured to control the substrate processing apparatus 1 to calculate each linear expression representing a movement direction of the substrate, based on the generated approximate curve for each transfer position. The controller is configured to control the substrate processing apparatus 1 to calculate the intersection coordinate of the calculated linear expressions. As a result, the substrate transfer position can be accurately and easily adjusted.

Further, according to the second embodiment, the approximate curve is generated after the flattening process is performed on the etching rate acquired for each transfer position. As a result, an approximate curve from which the noise component is removed can be generated.

Further, according to each embodiment, the approximate curve is a sine approximate curve. As a result, it is possible to detect the deviation of the wafer W in the horizontal direction with respect to the edge ring.

Further, according to each embodiment, the concentric circle has a distance of 30 mm or less from the end portion of the substrate. As a result, it is possible to detect the deviation of the etching rate of the wafer W in the circumferential direction.

Further, according to the second embodiment, the substrate processing apparatus 1 is configured to control to adjust the transfer position of the substrate on the first placement surface based on the calculated intersection coordinate. As a result, it is possible to perform the teaching quantitatively.

Further, according to the first embodiment, the substrate processing apparatus 1 includes: the process module 20 provided with a stage provided inside a chamber, having a first placement surface on which a substrate is to be placed and a second placement surface disposed on the outer periphery of the first placement surface, and an edge ring placed on the second placement surface; the measurement unit 38 that measures the etching rate of the substrate; and a controller. The controller is configured to control the substrate processing apparatus to etch the substrate under a specific processing condition. The controller is configured to control the substrate processing apparatus 1 to acquire etching rates at a plurality of points on the concentric circle of the substrate in the vicinity of the end portion of the substrate from the measurement unit 38. The controller is configured to control the substrate processing apparatus 1 to generate an approximate curve of the concentric circle in the circumferential direction based on the acquired etching rates. The controller is configured to control the substrate processing apparatus 1 to determine the movement direction of the substrate based on the generated approximate curve. The controller is configured to control the substrate processing apparatus 1 to calculate the movement amount of the substrate in the determined movement direction based on the etching rate or the approximate curve. As a result, the substrate transfer position can be accurately and easily adjusted.

Further, according to the first embodiment, the approximate curve is generated after the flattening process is performed on the acquired etching rate. As a result, an approximate curve from which the noise component is removed can be generated.

Further, according to the first embodiment, the movement amount is calculated with reference to a database representing the relationship between the movement amount and the etching rate, or the relationship between the movement amount and the amplitude of the approximate curve. As a result, the substrate transfer position can be adjusted by once teaching.

Further, according to the first embodiment, the substrate processing apparatus 1 is configured to control the substrate processing apparatus 1 to adjust the transfer position of the substrate on the first placement surface based on the movement direction and the movement amount. As a result, it is possible to perform the teaching quantitatively.

It shall be understood that each embodiment disclosed herein is illustrative and is not restrictive in all aspects. Each embodiment described above may be omitted, replaced, or modified in various forms without departing from the scope and spirit of the appended claims.

Further, in each embodiment described above, the measurement unit 38 is provided in the substrate processing apparatus 1, but the present disclosure is not limited thereto. For example, the wafer W after the etching process may be transferred to another measurement apparatus, and the etching rate may be measured by another measurement apparatus.

In each embodiment described above, the process module 20 that performs a process such as etching on the wafer W by using a capacitively-coupled plasma as a plasma source has been described by way of example, but the technique disclosed herein is not limited thereto. As long as the apparatus performs a process on the wafer W by using plasma, the plasma source is not limited to the capacitively-coupling plasma, and any plasma source such as inductive coupling plasma, microwave plasma, or magnetron plasma can be used.

According to the present disclosure, a substrate transfer position can be accurately and easily adjusted.

While certain embodiments have been described, these embodiments have been presented by way of example only and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
    a process module that includes a stage provided inside a chamber, having a first placement surface on which a substrate is to be placed and a second placement surface disposed on an outer periphery of the first placement surface, and an edge ring placed on the second placement surface;
    a measurement unit that measures an etching rate of the substrate; and
    a controller, wherein
    the controller is configured to control the substrate processing apparatus to transfer the substrate to different transfer positions on the first placement surface and etch the substrate for each transfer position under a specific processing condition,
    the controller is configured to control the substrate processing apparatus to acquire etching rates at a plurality of points on a concentric circle of the substrate in a vicinity of an end portion of the substrate, for each transfer position, from the measurement unit,
    the controller is configured to control the substrate processing apparatus to generate an approximate curve of each of the concentric circles in a circumferential direction based on each of the acquired etching rates for each transfer position, the controller is configured to control the substrate processing apparatus to calculate each linear expression representing a movement direction of the substrate, based on the generated approximate curve for each transport position, and the controller is configured to control the substrate processing apparatus to calculate an intersection coordinate of the calculated linear expressions.

2. The substrate processing apparatus according to claim 1, wherein
the approximate curve is a sine approximate curve.

3. The substrate processing apparatus according to claim 1, wherein
the concentric circle has a distance of 30 mm or less from the end portion of the substrate.

4. The substrate processing apparatus according to claim 1, wherein
the controller is configured to control the substrate processing apparatus to adjust the transfer position of the substrate on the first placement surface based on the calculated intersection coordinate.

5. The substrate processing apparatus of claim 1, wherein
the approximate curve is generated after a flattening process is performed on the acquired etching rate for each transfer position.

6. The substrate processing apparatus according to claim 5, wherein
the approximate curve is a sine approximate curve.

7. The substrate processing apparatus according to claim 6, wherein
the concentric circle has a distance of 30 mm or less from the end portion of the substrate.

8. The substrate processing apparatus according to claim 7, wherein
the controller is configured to control the substrate processing apparatus to adjust the transfer position of the substrate on the first placement surface based on the calculated intersection coordinate.

9. A substrate processing apparatus comprising:
a process module that includes a stage provided inside a chamber, having a first placement surface on which a substrate is to be placed and a second placement surface disposed on an outer periphery of the first placement surface, and an edge ring placed on the second placement surface;
a measurement unit that measures an etching rate of the substrate; and
a controller, wherein
the controller is configured to control the substrate processing apparatus to etch the substrate under a specific processing condition,
the controller is configured to control the substrate processing apparatus to acquire etching rates at a plurality of points on a concentric circle of the substrate in a vicinity of an end portion of the substrate from the measurement unit,
the controller is configured to control the substrate processing apparatus to generate an approximate curve of the concentric circle in a circumferential direction based on the acquired etching rates,
the controller is configured to control the substrate processing apparatus to determine a movement direction of the substrate based on the generated approximate curve, and
the controller is configured to control the substrate processing apparatus to calculate a movement amount of the substrate in the determined movement direction based on the etching rates or the approximate curve.

10. The substrate processing apparatus according to claim 9, wherein
the approximate curve is a sine approximate curve.

11. The substrate processing apparatus according to claim 9, wherein
the concentric circle has a distance of 30 mm or less from the end portion of the substrate.

12. The substrate processing apparatus according to claim 9, wherein
the amount of movement is calculated with reference to a database representing a relationship between the movement amount and the etching rate or a relationship between the movement amount and an amplitude of the approximate curve.

13. The substrate processing apparatus according to claim 9, wherein
the controller is configured to control the substrate processing apparatus to adjust a transfer position of the substrate on the first placement surface based on the movement direction and the movement amount.

14. The substrate processing apparatus of claim 9, wherein
the approximate curve is generated after a flattening process is performed on the acquired etching rate.

15. The substrate processing apparatus according to claim 14, wherein
the approximate curve is a sine approximate curve.

16. The substrate processing apparatus according to claim 15, wherein
the concentric circle has a distance of 30 mm or less from the end portion of the substrate.

17. The substrate processing apparatus according to claim 16, wherein
the movement amount is calculated with reference to a database representing a relationship between the movement amount and the etching rate or a relationship between the movement amount and an amplitude of the approximate curve.

18. The substrate processing apparatus according to claim 17, wherein
the controller is configured to control the substrate processing apparatus to adjust a transfer position of the substrate on the first placement surface based on the movement direction and the movement amount.

19. A substrate transfer position adjustment method in a substrate processing apparatus, the substrate processing apparatus comprising: a process module that includes a stage provided inside a chamber, having a first placement surface on which a substrate is to be placed and a second placement surface disposed on an outer periphery of the first placement surface, and an edge ring placed on the second placement surface; a measurement unit that measures an etching rate of the substrate; and a controller, the method comprising:
transferring the substrate to different transfer positions on the first placement surface and etching the substrate for each transfer position under a specific processing condition;
acquiring etching rates at a plurality of points on a concentric circle of the substrate in a vicinity of an end portion of the substrate, for each transfer position, from the measurement unit;
generating an approximate curve of each of the concentric circles in a circumferential direction based on each of the acquired etching rates for each transfer position;

calculating each linear expression representing a movement direction of the substrate, based on the generated approximate curve for each transport position; and calculating an intersection coordinate of the calculated linear expressions.

\* \* \* \* \*

UNITED STATES PATENT AND TRADEMARK OFFICE
CERTIFICATE OF CORRECTION

| | | |
|---|---|---|
| PATENT NO. | : 12,288,678 B2 | Page 1 of 1 |
| APPLICATION NO. | : 17/706465 | |
| DATED | : April 29, 2025 | |
| INVENTOR(S) | : Joji Takayoshi et al. | |

It is certified that error appears in the above-identified patent and that said Letters Patent is hereby corrected as shown below:

On the Title Page

Please add item (30) Foreign Priority Data as:
March 29, 2021 (JP) 2021-055553

Signed and Sealed this
Tenth Day of June, 2025

Coke Morgan Stewart
*Acting Director of the United States Patent and Trademark Office*